(12) United States Patent
Yamanaka

(10) Patent No.: US 9,985,504 B2
(45) Date of Patent: May 29, 2018

(54) ELECTRONIC APPARATUS

(71) Applicant: DENSO CORPORATION, Kariya, Aichi-pref. (JP)

(72) Inventor: Takahiro Yamanaka, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days. days.

(21) Appl. No.: 15/341,391

(22) Filed: Nov. 2, 2016

(65) Prior Publication Data
US 2017/0126104 A1 May 4, 2017

(30) Foreign Application Priority Data

Nov. 4, 2015 (JP) ................. 2015-216504

(51) Int. Cl.
| | |
|---|---|
| *G05B 5/00* | (2006.01) |
| *H02K 11/25* | (2016.01) |
| *H01R 12/55* | (2011.01) |
| *H05K 7/00* | (2006.01) |
| *H02K 11/33* | (2016.01) |
| *H02K 9/22* | (2006.01) |

(52) U.S. Cl.
CPC .............. *H02K 11/25* (2016.01); *H01R 12/55* (2013.01); *H02K 11/33* (2016.01); *H05K 7/00* (2013.01); *H02K 9/22* (2013.01)

(58) Field of Classification Search
CPC .................. H02K 11/33; H02K 9/22
See application file for complete search history.

(56) References Cited

U.S. PATENT DOCUMENTS

| | | | |
|---|---|---|---|
| 2008/0230302 A1 | 9/2008 | Tamaki | |
| 2010/0163326 A1* | 7/2010 | Takamura | B60K 1/04 180/68.5 |
| 2011/0315470 A1 | 12/2011 | Uryu | |

FOREIGN PATENT DOCUMENTS

JP   2015-077791 A   4/2015

* cited by examiner

*Primary Examiner* — Karen Masih
(74) *Attorney, Agent, or Firm* — Knobbe, Martens, Olson & Bear, LLP

(57) ABSTRACT

A primary strut, which extends integrally from a heat sink main body, supports a circuit board at a location between a connector terminal and one of a switching device or a drive wiring. A secondary strut, which extends integrally from the heat sink main body, supports the circuit board at a location that is on an opposite side of the switching device and the drive wiring, which is opposite from the connector terminal. A temperature sensor is installed to the circuit board at a location, which is spaced from the primary strut, the switching device and the drive wiring, and at which the temperature sensor senses a temperature of the secondary strut. A control device limits an electric current supplied to the switching device upon estimating a temperature of the switching device while using the temperature, which is sensed with the temperature sensor, as a reference temperature.

5 Claims, 11 Drawing Sheets

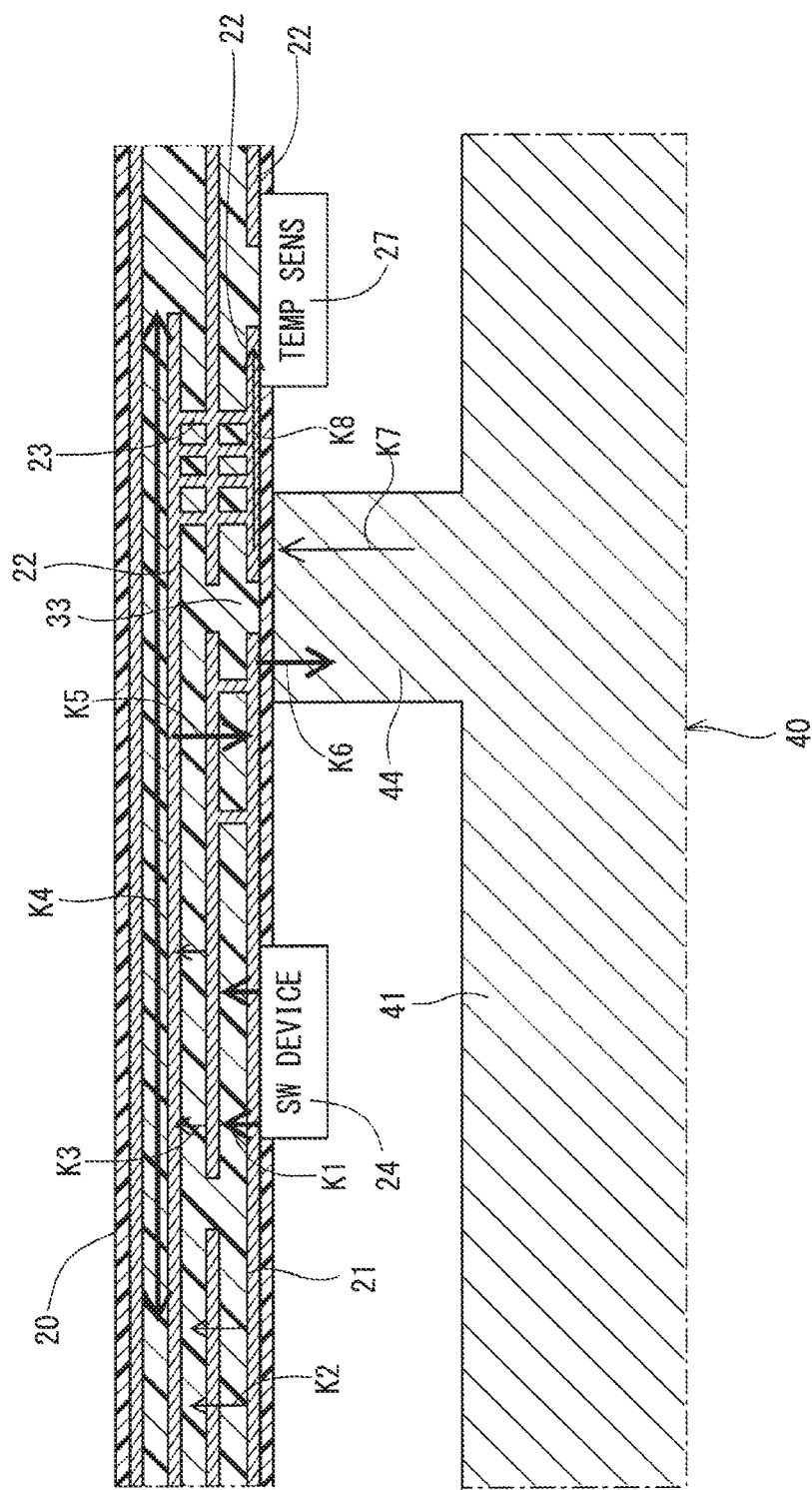

ELECTRONIC APPARATUS

CROSS REFERENCE TO RELATED APPLICATION

This application is based on and incorporates herein by reference Japanese Patent Application No. 2015-216504 filed on Nov. 4, 2015.

TECHNICAL FIELD

The present disclosure relates to an electronic apparatus that controls a drive operation of an electric motor.

BACKGROUND

Previously, a known electronic apparatus controls a drive operation of an electric motor of, for example, an electric power steering system through a plurality of drive circuits that form a plurality of systems, respectively. In a case where one of the drive circuits fails, the electronic control apparatus stops the failed drive circuit and executes the control operation for driving the electric motor through the remaining normal one of the drive circuits.

For example, an electronic apparatus of JP2008-230540A (corresponding to US2008/0230302A1) has a thermistor, which functions as a temperature sensor. This electronic apparatus limits the amount of electric current supplied to electronic components in such a manner that the temperature of the electronic components is kept within a temperature range, in which the electronic components are operable, while the temperature sensed with the thermistor is used as a reference temperature. In this way, the electronic apparatus limits thermal destruction of the electronic components.

However, in the electronic apparatus of JP2008-230540A (corresponding to US2008/0230302A1), a location of the thermistor on the circuit board is not defined. Therefore, in the case of the electronic apparatus having the multiple drive circuits that form the multiple systems, respectively, the following disadvantages may possibly occur depending on the location of the thermistor.

For instance, it is assumed that the thermistor is placed at a location where one of the drive circuits, which form the multiple systems, respectively, has a large influence on the thermistor. In such a case, when the one of the drive circuits fails, the temperature, which is sensed with the thermistor, is decreased. In such a case, the amount of electric current, which can be supplied to the remaining normal one(s) of the drive circuits, is set based on the reference temperature that is lower than the actual temperature of the electronic components of the normal drive circuit(s). Therefore, when the excess amount of electric current, which may cause an increase in the temperature of the electronic components beyond the operable temperature of the electronic components, is supplied to the electronic components of the normal drive circuit, the normal drive circuit may possibly fail due to the excess amount of heat generated from the electronic components of the normal drive circuit.

In order to address the above disadvantage, it is conceivable to provide a plurality of thermistors to the drive circuits, respectively, which form the multiple systems. However, in such a case, a size of the electronic apparatus is disadvantageously increased, and the costs of the electronic apparatus are disadvantageously increased.

SUMMARY

The present disclosure is made in view of the above disadvantages.

According to the present disclosure, there is provided an electronic apparatus for controlling a drive operation of an electric motor. The electronic apparatus includes a circuit board, a connector terminal, a plurality of heat-generating devices, a drive wiring, a heat sink main body, a primary strut, a secondary strut, a temperature sensor and a control device. The connector terminal is installed to the circuit board and receives an electric current, which is supplied from an external electric power source to a coil of the electric motor. The plurality of heat-generating devices is installed to the circuit board and generates heat when the electric current to be supplied to the coil is conducted through the plurality of heat-generating devices. The drive wiring is installed to the circuit board and conducts the electric current among a motor wiring, which is connected to the coil, the plurality of heat-generating devices, and the connector terminal. The heat sink main body absorbs the heat generated from the plurality of heat-generating devices. The primary strut extends integrally from the heat sink main body and supports the circuit board at a location between: the connector terminal; and one of the plurality of the heat-generating devices, the drive wiring, or the motor wiring. The secondary strut extends integrally from the heat sink main body and supports the circuit board at a location that is on an opposite side of the plurality of heat-generating devices, the drive wiring and the motor wiring, which is opposite from the connector terminal. The temperature sensor is installed to the circuit board at a location, which is spaced from the primary strut, the plurality of heat-generating devices, the drive wiring and the motor wiring, and at which the temperature sensor senses a temperature of the secondary strut. The control device limits the electric current supplied to the plurality of heat-generating devices while using the temperature, which is sensed with the temperature sensor, as a reference temperature.

BRIEF DESCRIPTION OF THE DRAWINGS

The drawings described herein are for illustration purposes only and are not intended to limit the scope of the present disclosure in any way.

FIG. 11 is a cross sectional view taken along line XI-XI in FIG. 10.

DETAILED DESCRIPTION

Hereinafter, embodiments of the present disclosure will be described with reference to the accompanying drawings. Furthermore, in a case where a plurality of structures (components), which are substantially identical to each other, is indicated in each of the drawings, only one or more of the structures (components) is indicated with a corresponding reference sign.

First Embodiment

A first embodiment of the present disclosure will be described with reference to FIGS. 1 to 5C. An electronic apparatus 1 of the present embodiment is used in a drive apparatus 2 that generates a steering assist torque in an electric power steering system of a vehicle (e.g., an automobile).

Figure 1:
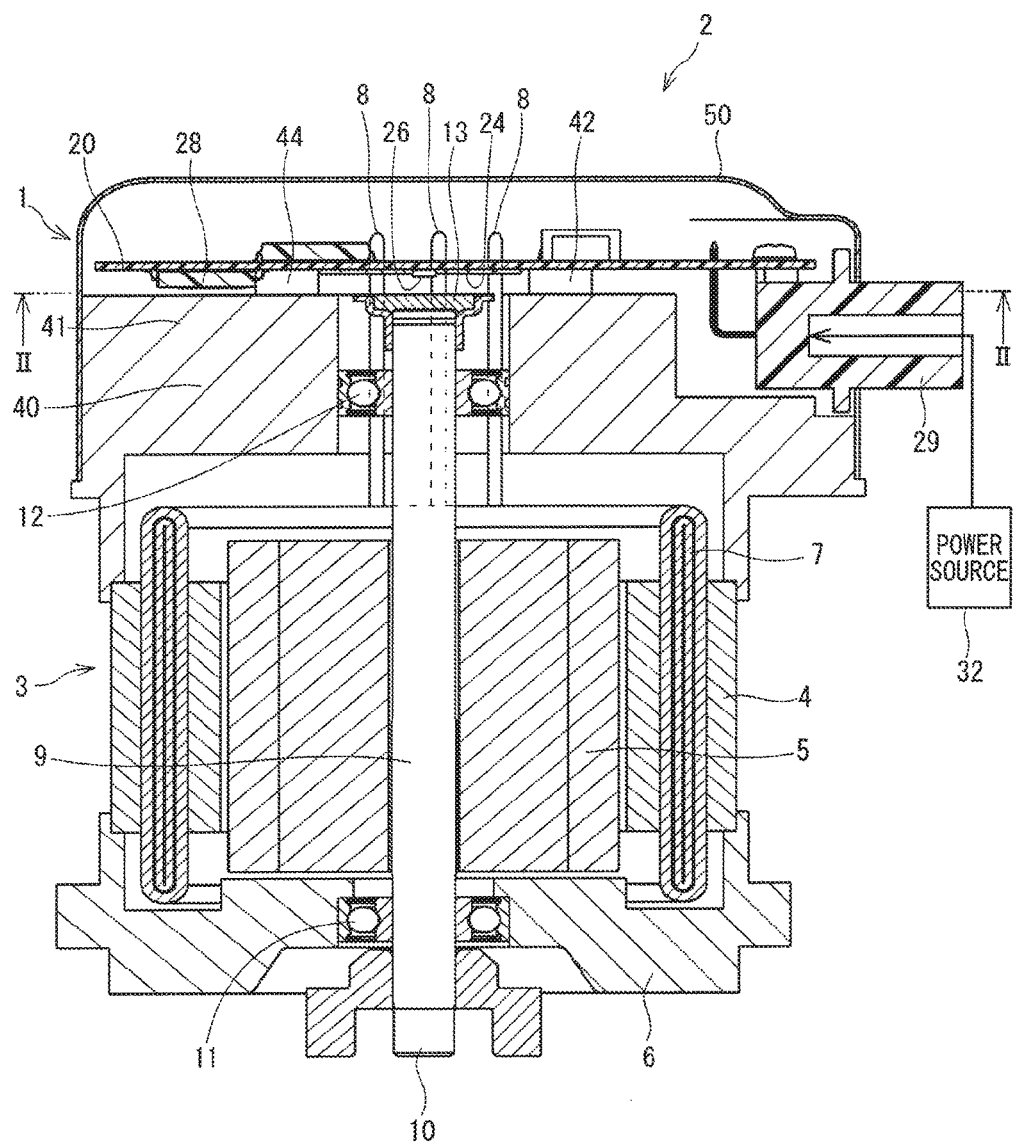
FIG. 1 is a cross sectional view of a drive apparatus of an electric power steering system, in which an electronic apparatus of a first embodiment of the present disclosure is implemented.

As shown in FIG. 1, the drive apparatus 2 includes the electronic apparatus 1 and an electric motor 3. The electronic apparatus 1 controls a drive operation of the electric motor 3.

Hereinafter, a structure of the electric motor 3, a structure of the electronic apparatus 1, and a characteristic structure of the electronic apparatus 1 will be sequentially described.

(Structure of Electric Motor)

The electric motor 3 includes a stator 4 and a rotor 5. The stator 4 is shaped into a cylindrical tubular form. One axial end of the stator 4 is fixed to a frame end 6, and another axial end of the stator 4 is fixed to a heat sink 40. Coils 7 are wound around slots of the stator 4. A motor wiring (the motor wiring including a plurality of motor wires, i.e., motor conductive lines) 8, which extends from the coils 7, is connected to a drive wiring (the drive wiring including a plurality of drive wires, i.e., drive conductive lines) 21 of a circuit board 20 of the electronic apparatus 1 (see FIG. 2).

The rotor 5 is shaped into a cylindrical tubular form and is placed on a radially inner side of the stator 4 in such a manner that the rotor 5 is rotatable relative to the stator 4. A shaft 9 is fixed to a center of the rotor 5. One end portion of the shaft 9, which is located on a side where an output end 10 of the shaft 9 is placed, is rotatably supported by a bearing 11 that is installed to the frame end 6. Another end portion of the shaft 9, which is opposite from the one end portion of the shaft 9, is rotatably supported by a bearing 12, which is installed to the heat sink 40.

When the electronic apparatus 1 energizes the coils 7 of the electric motor 3 through the motor wiring 8, a rotating magnetic field is generated in the stator 4. Thereby, the rotor 5 and the shaft 9 are rotated about a rotational axis thereof.

(Structure of Electronic Apparatus)

Figure 2:
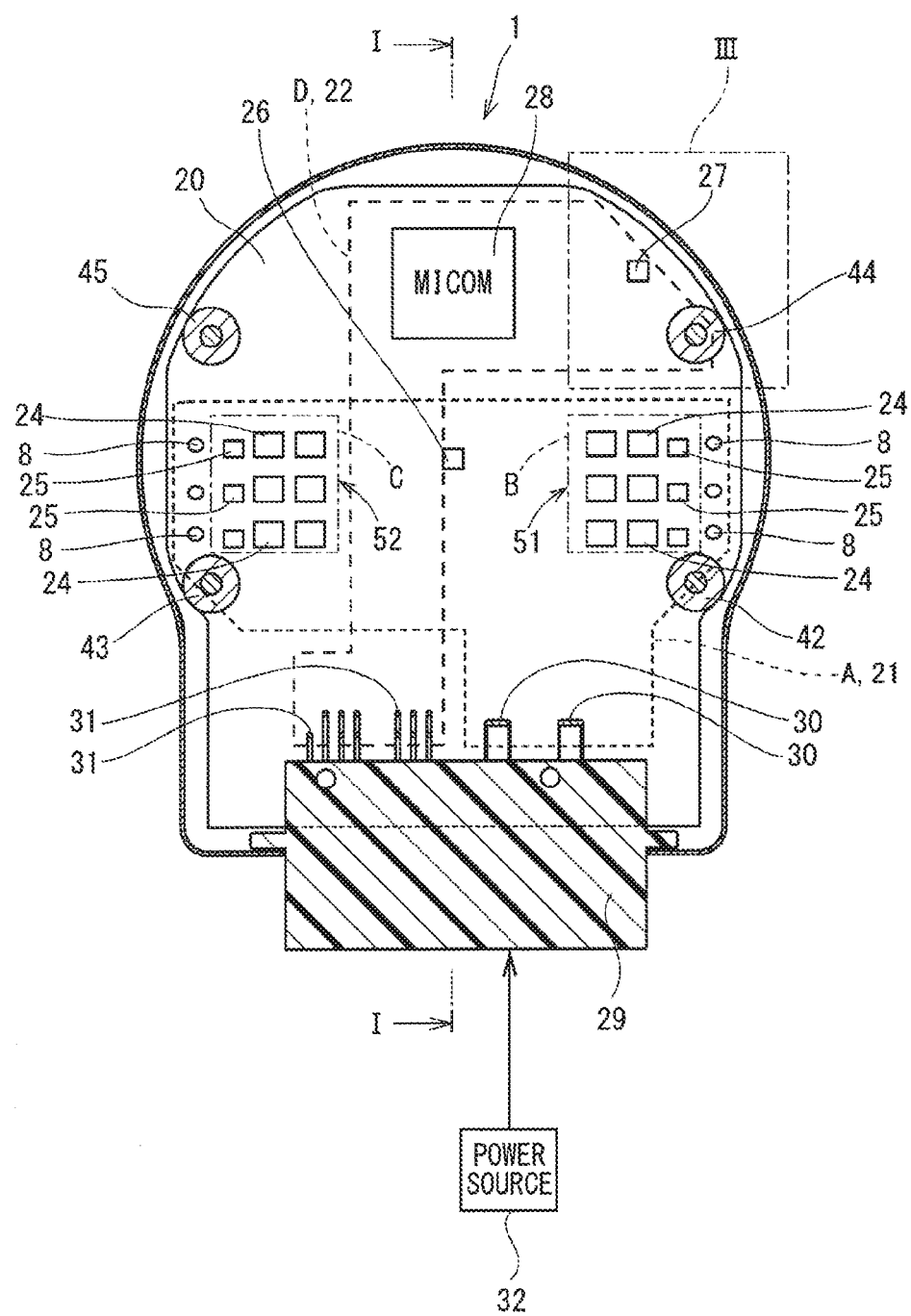
FIG. 2 is a cross sectional view taken along line II-II in FIG. 1.

As shown in FIGS. 1 and 2, the electronic apparatus 1 includes a circuit board (a single circuit board) 20, various electronic components 24-28, the heat sink 40 and a cover 50. The electronic components 24-28 are installed on the circuit board 20. The circuit board 20 is installed to the heat sink 40.

Figure 4:
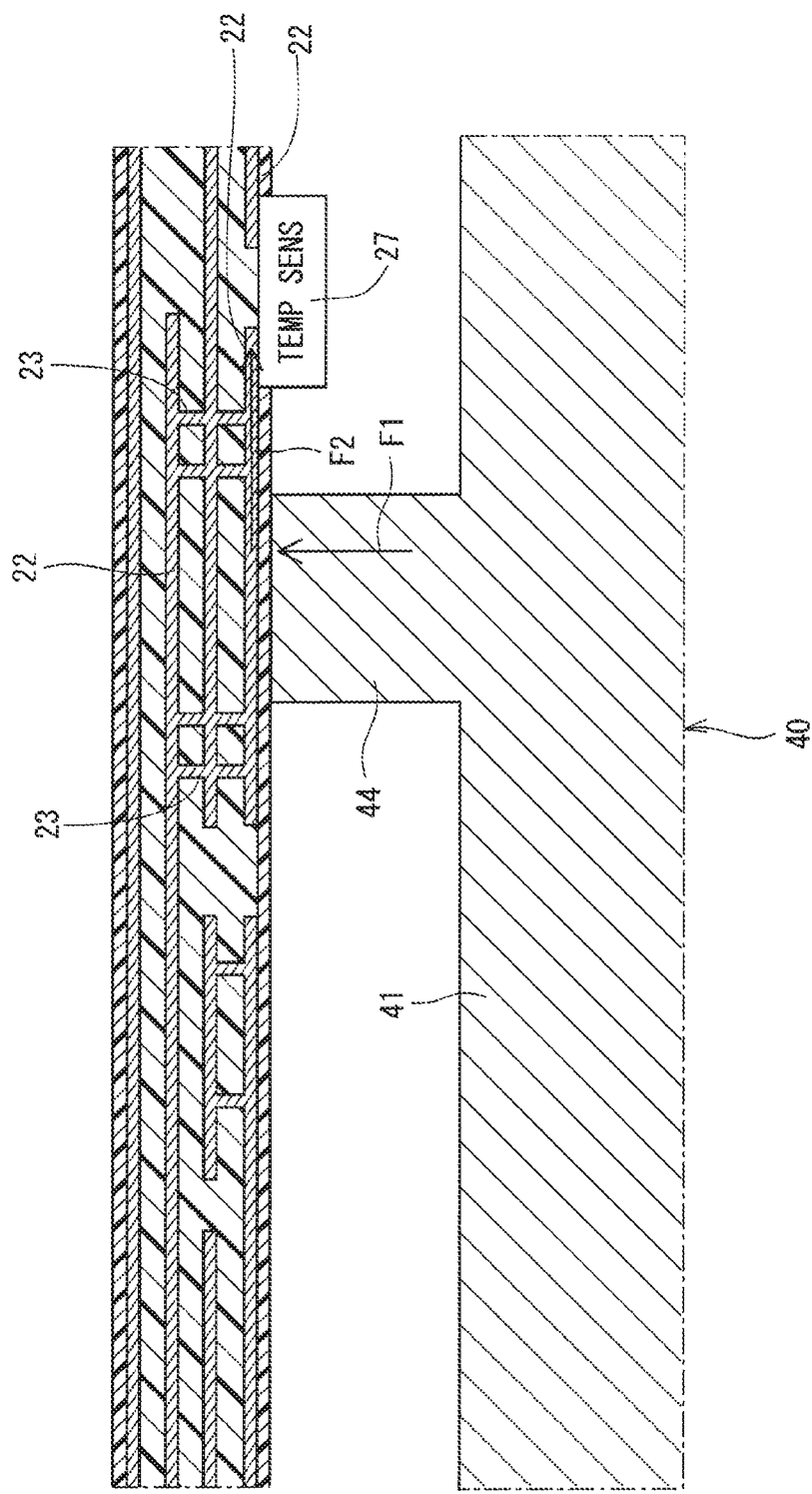
FIG. 4 is a cross sectional view taken along line IV-IV in FIG. 3.

The circuit board 20 is a multilayer circuit board that includes the wirings 21, 22, which are formed in layers, and via holes (or simply referred to as vias that are plated holes) 23, as shown in FIG. 4.

The electronic components, which are installed to the circuit board 20, include, for example, switching devices 24 (also referred to as switching elements, such as MOSFETs), shunt resistors 25, a position sensor 26, a temperature sensor 27, a microcomputer 28 and ICs.

Some of the electronic components of the present embodiment, such as the switching devices 24 and the shunt resistors 25, which generate the heat upon energization thereof, serve as heat-generating devices (also referred to as heat-generating elements) of the present disclosure.

Furthermore, some of the electronic components of the present embodiment, such the microcomputer 28 and the ICs, serve as control devices (also referred to as control elements) of the present disclosure.

Furthermore, a connector 29 is installed to the circuit board 20. The connector 29 includes connector terminals (also referred to as coil side connector terminals) 30 and control connector terminals 31. A large current to be supplied from an external electric power source 32 to the coils 7 of the electric motor 3 is supplied through the connector terminals 30.

The connector terminals 30, the switching devices 24, the shunt resistors 25 and the motor wiring 8 are electrically connected through the drive wiring 21, which is formed on the circuit board 20. The drive wiring 21 is for conducting the large current to be supplied to the coils 7 of the electric motor 3 through the corresponding electronic components discussed above. In FIG. 2, an area, in which the drive wiring 21 is formed, is indicated by a dotted line A. Furthermore, in this specification, the drive wiring 21 refers to the drive wiring 21 at both of the electric power source side and the ground side.

Corresponding ones of the switching devices 24, corresponding ones of the shunt resistors 25 and a portion of the drive wiring 21, which are placed in an area B on the right side in FIG. 2, form a first drive circuit 51. Corresponding ones of the switching devices 24, corresponding ones of the shunt resistors 25 and another portion of the drive wiring 21, which are placed in an area C on the left side in FIG. 2, form a second drive circuit 52. Each of the first drive circuit 51 and the second drive circuit 52 of the present embodiment is formed as, for example, a three-phase inverter circuit. That is, the electronic apparatus 1 of the present embodiment drives the electric motor 3 through the drive circuits 51, 52, which form multiple systems, respectively (two systems in this embodiment).

The switching devices 24 discussed above include switching devices, which form the three-phase inverter circuit for supplying the electric current to the electric motor 3, and a switching device, which can turn on and off the electric power to be supplied from the connector terminal 30 to the three-phase inverter circuit. The shunt resistors 25 are used for measuring the electric current that flows through the switching devices 24 of the three-phase inverter circuit.

An electric power for operating the position sensor 26, the temperature sensor 27, the microcomputer 28 and the ICs is supplied through the control connector terminals 31 of the connector 29. The control connector terminals 31, the position sensor 26, the temperature sensor 27, the microcomputer 28 and the ICs are electrically connected through a control wiring (the control wiring including a plurality of control wires, i.e., control conductive lines) 22, which is formed on the circuit board 20. The control wiring 22 conducts a relatively small electric current among the electronic components, such as the position sensor 26, the temperature sensor 27, the microcomputer 28 and the ICs. In FIG. 2, an area, in which the control wiring 22 is formed, is indicated by a dotted line D. Furthermore, in this specification, the control wiring 22 refers to the control wiring 22 at both of the electric power source side and the ground side.

In FIG. 2, in an overlapped area, in which the drive wiring 21 and the control wiring 22 are overlapped with each other (i.e., an overlapped area where the area of the dotted line A and the area of the dotted line D are overlapped with each other), the drive wiring 21 and the control wiring 22 are formed in different layers, respectively.

The position sensor 26 senses a magnetic field of a magnet 13, which is installed to an end portion of the shaft 9 of the electric motor 3, to sense a rotational angle of the rotor 5. The microcomputer 28 controls the amount of electric current, which flows through the switching devices 24, based on the rotational angle of the rotor 5 sensed with the position sensor 26 and the required assist torque for the steering operation to control the supply of the electric current from the first drive circuit 51 and the second drive circuit 52 to the coils 7.

The temperature sensor 27 is a single temperature sensor installed to the circuit board 20. The temperature sensor 27 is, for example, a thermistor that changes an electrical resistance thereof dependent on the temperature. The temperature sensor 27 is electrically connected to the microcomputer 28 through the control wiring 22. The microcomputer 28 can sense the temperature of the temperature sensor 27 and its vicinity through energization of the temperature sensor 27. In view of the temperature, which is sensed with the temperature sensor 27, the microcomputer 28 limits the amount of electric current supplied to the electronic components (e.g., the switching devices 24) in such a manner that a temperature, which is a sum of the exothermic temperatures of the electronic components, is kept within a temperature range, in which the electronic components are operable. The sum of the exothermic temperatures of the electronic components is computed based on an integral value of the amounts of electric current supplied to the electronic components, respectively.

In a case where one of the first drive circuit 51 or the second drive circuit 52 fails, the microcomputer 28 can stop the supply of the electric current to the failed one of the first drive circuit 51 or the second drive circuit 52 and can drive the other one of the first drive circuit 51 or the second drive circuit 52, which is normal. Even in such a case, the microcomputer 28 limits the amount of the electric current supplied to the normal one of the first drive circuit 51 or the second drive circuit 52 in such a manner that the temperature is kept within a range that enables the operation of, for example, the switching devices 24 of the normal one of the first drive circuit 51 or the second drive circuit 52. This point will be described later.

The heat sink 40 is made of a material, such as aluminum, which has high heat conductivity and a large heat capacity. The heat sink 40 absorbs the heat generated from the switching devices 24 and/or the shunt resistors 25 at the time of supplying the electric current thereto. The heat sink 40 includes a heat sink main body 41 and four struts 42-45. The struts 42-45 are formed integrally with the heat sink main body 41 (more specifically, the struts 42-45 being formed integrally and seamlessly with the heat sink main body 41) such that the struts 42-45 extend from the heat sink main body 41 toward the circuit board 20 side. The circuit board 20 is fixed to the four struts 42-45 with, for example, screws.

In the present embodiment, the four struts 42-45 of the heat sink 40 include two primary struts 42, 43 and two secondary struts 44, 45. The primary struts 42, 43 support the circuit board 20 at a location between the connector terminals 30 and one (or more) of the switching devices 24, the drive wiring 21, or the motor wiring 8. The secondary struts 44, 45 support the circuit board 20 at a location that is on an opposite side of the switching device 24, the drive wiring 21 and the motor wiring 8, which is opposite from the connector terminals 30 in a plane of the circuit board 20.

As indicated by a dotted line A in FIG. 2, the drive wiring 21 is connected to the primary struts 42, 43 and is not connected to the secondary struts 44, 45. Therefore, the heat, which is generated from, for example, the drive wiring 21 and the switching devices 24, is absorbed by the heat sink main body 41 through the primary struts 42, 43. The heat sink main body 41 has the large heat capacity, so that the temperature of the heat sink main body 41 is mostly stable except the vicinity of the primary struts 42, 43.

As indicated by the dotted line D in FIG. 2, the control wiring 22 is connected to the secondary strut 44 and is not connected to the primary struts 42, 43. The temperature of the secondary strut 44 is substantially the same as the temperature of the portion of the heat sink main body 41, which has the substantially stable temperature.

(Characteristic Structure of Electronic Apparatus)

Next, the characteristic structure of the electronic apparatus 1 of the present embodiment will be described with reference to FIGS. 3 to 5.

Figure 3:
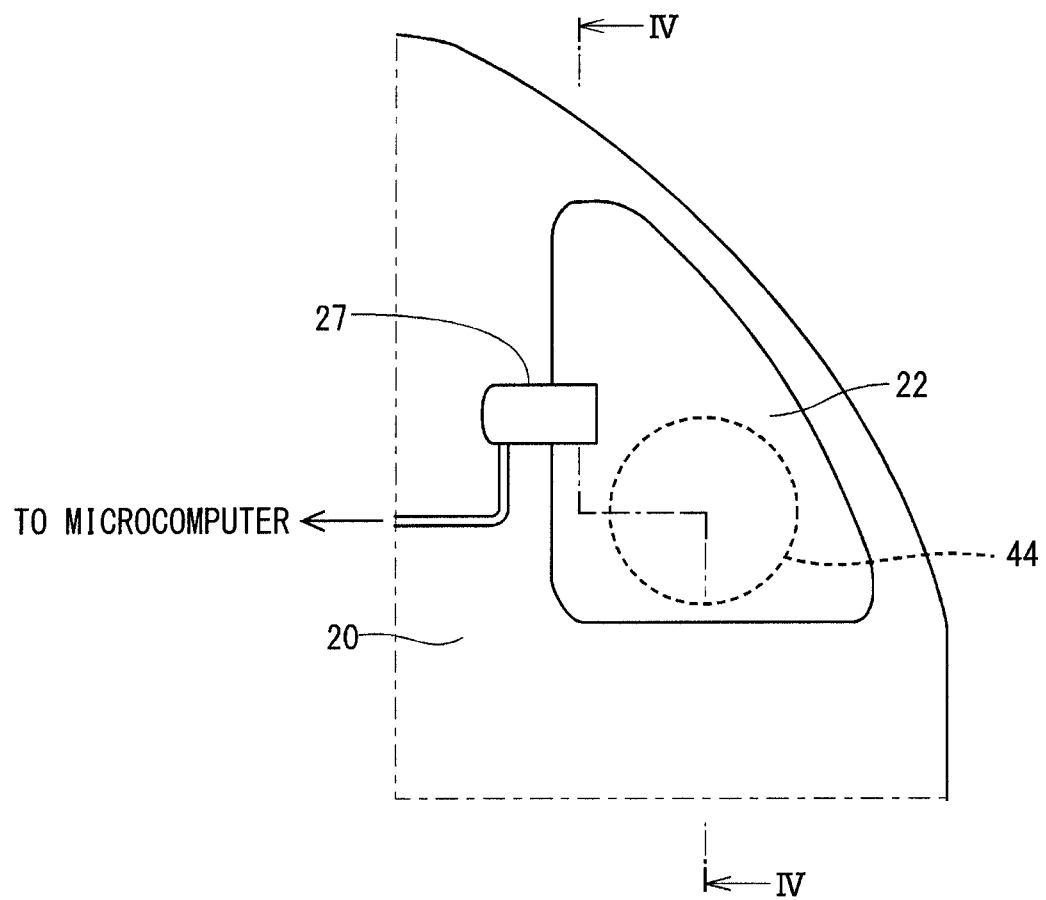
FIG. 3 is a schematic diagram of a surface wiring in an area III in FIG. 2.

FIG. 3 schematically indicates an outer layer of the circuit board 20 in a portion III in FIG. 2. In FIG. 3, the location of the secondary strut 44 is indicated by a dotted line. Furthermore, FIG. 4 schematically indicates a cross section taken along line IV-IV in FIG. 3.

As discussed above, the electronic apparatus 1 of the present embodiment is characterized by the location of the temperature sensor 27 on the circuit board 20.

The temperature sensor 27 is placed adjacent to the secondary strut 44 that is the one of the two secondary struts 44, 45, which is located at the side where the first drive circuit 51 is placed. However, the secondary strut 44 is placed at the location, which is spaced from the drive wiring 21 and the switching devices 24. Therefore, the temperature of the secondary strut 44 is stable like the heat sink main body 41.

The control wiring 22, which is connected to the temperature sensor 27, is connected to the secondary strut 44. Therefore, as indicated by arrows F1, F2 in FIG. 4, the heat of the heat sink main body 41 is conducted from the secondary strut 44 to the temperature sensor 27 through the control wiring 22. Thus, the microcomputer 28 can sense the temperature of the secondary strut 44, which has the stable temperature like the heat sink main body 41, through the temperature sensor 27.

Figure 5A:
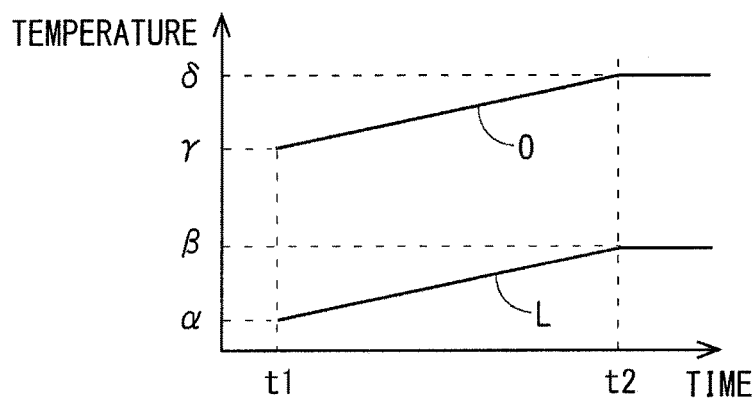
FIGS. 5A to 5C are graphs that indicate a change in a sensed temperature of a temperature sensor and a change in an exothermic temperature of heat-generating devices with time according to the first embodiment.
Figure 5B:
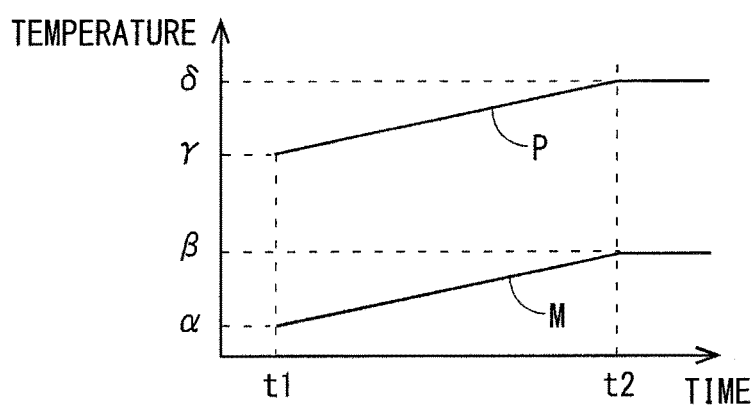
Figure 5C:
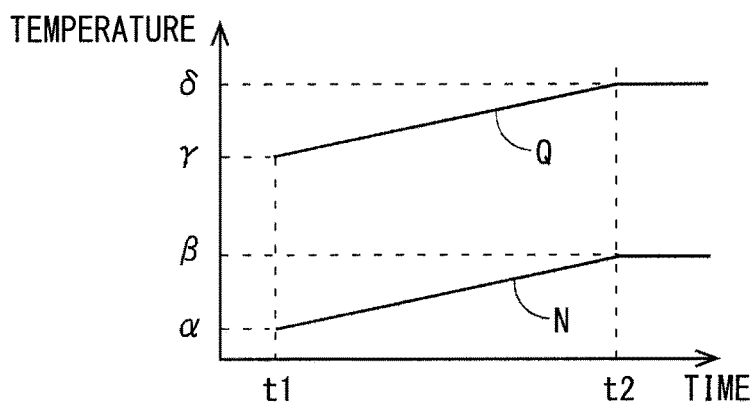

In FIGS. 5A, 5B, 5C, a lower solid line L, M, N indicates the temperature of the temperature sensor 27 that is sensed by the microcomputer 28. In FIGS. 5A, 5B, 5C, an upper solid line O, P, Q indicates the temperature of the switching devices 24, which is estimated by the microcomputer 28. The microcomputer 28 estimates the temperature of the switching devices 24 based on the temperature, which is sensed with the temperature sensor 27, and the sum of the exothermic temperatures of the switching devices 24, which is computed based on the integral value of the amounts of electric current supplied to the switching devices 24.

The graph of FIG. 5A indicates a change in the temperature L of the temperature sensor 27 and a change in the estimated temperature O of the switching devices 24 in the case where both of the first drive circuit 51 and the second drive circuit 52 of the electronic apparatus 1 are normally operated. In this case, during the time period from the time t1 to the time t2, the temperature L of the temperature sensor 27 changes from the temperature α to the temperature β, and the estimated temperature O of the switching devices 24 changes from the temperature γ to the temperature δ. Here, it should be noted that the temperature δ is the operable temperature of the switching devices 24.

The graph of FIG. 5B indicates a change in the temperature M of the temperature sensor 27 and a change in the estimated temperature P of the switching devices 24 of the second drive circuit 52 in the case where the first drive circuit 51 fails. In this case, during the time period from the time t1 to the time t2, the temperature M of the temperature sensor 27 changes from the temperature α to the temperature β, and the estimated temperature P of the switching devices 24 changes from the temperature γ to the temperature δ. That is, the temperature M of the temperature sensor 27 is substantially the same as the temperature L of the temperature sensor 27 in the case where the first drive circuit 51 and the second drive circuit 52 of the electronic apparatus 1 are normally operated. Therefore, the microcomputer 28 can accurately estimate the estimated temperature P of the switching devices 24 of the second drive circuit 52.

The graph of FIG. 5C indicates a change in the temperature N of the temperature sensor 27 and a change in the estimated temperature Q of the switching devices 24 of the first drive circuit 51 in the case where the second drive circuit 52 fails. In this case, during the time period from the time t1 to the time t2, the temperature N of the temperature sensor 27 changes from the temperature α to the temperature β, and the estimated temperature Q of the switching devices 24 changes from the temperature γ to the temperature δ. That is, the temperature N of the temperature sensor 27 is substantially the same as the temperature L of the temperature sensor 27 in the case where the first drive circuit 51 and the second drive circuit 52 of the electronic apparatus 1 are both normally operated. Therefore, the microcomputer 28 can accurately estimate the estimated temperature Q of the switching devices 24 of the first drive circuit 51.

In the present embodiment, as indicated in the graphs of FIGS. 5B and 5C, even in the case where one of the first drive circuit 51 or the second drive circuit 52 fails, the microcomputer 28 can accurately estimate the temperature of the switching devices 24 of the other normal one of the first drive circuit 51 or the second drive circuit 52. Therefore, the microcomputer 28 can limit the amount of electric current supplied to the switching devices 24 of the normal one of the first drive circuit 51 or the second drive circuit 52 in such a manner that the temperature does not exceed above the operable temperature of the switching devices 24 of the normal one of the first drive circuit 51 or the second drive circuit 52.

Now, an electronic apparatus 100 of a comparative example will be described with reference to FIGS. 6 to 8C.

Figure 6:
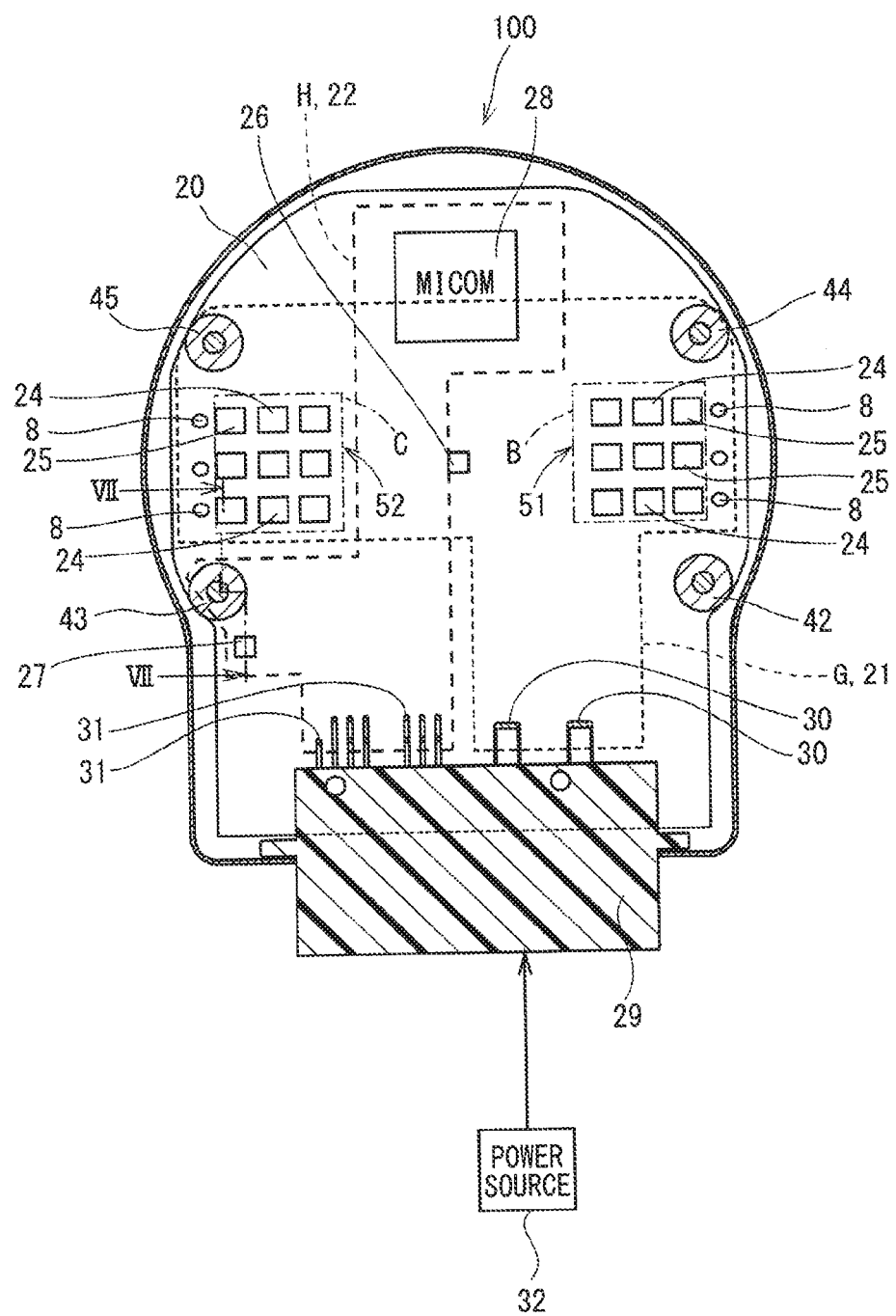
FIG. 6 is a schematic diagram of a circuit board of an electronic apparatus of a comparative example.

In the comparative example, the temperature sensor 27 is placed adjacent to the primary strut 43 that is the one of the two primary struts 42, 43, which is placed adjacent to the second drive circuit 52. The drive wiring 21 of the comparative example is formed in an area indicated by a dotted line G in FIG. 6. Thereby, the drive wiring 21 of the comparative example is connected to the secondary struts 44, 45 and is not connected to the primary strut 43. In contrast, the control wiring 22 of the comparative example, which is connected to the temperature sensor 27, is formed in an area indicated by a dotted line H in FIG. 6. As indicated in FIG. 6, the control wiring 22 of the comparative example is connected to the primary strut 43.

Figure 7:
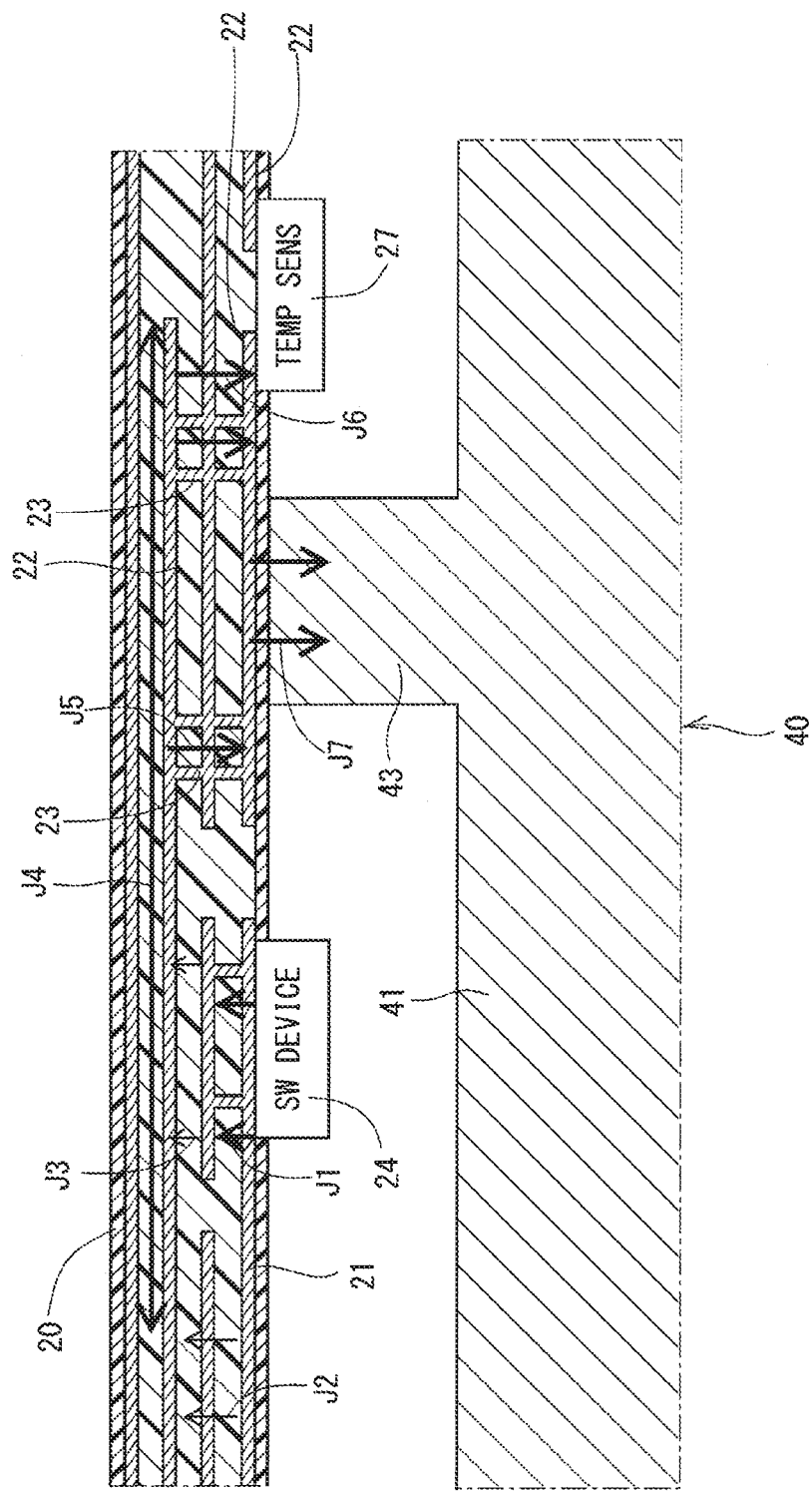
FIG. 7 is a cross sectional view taken along line VII-VII in FIG. 6.

In this case, as indicated by arrows J1-J7 in FIG. 7, the heat, which is generated from the switching devices 24 and the drive wiring 21, is conducted to the primary struts 42, 43 through the resin of the circuit board 20 and a wiring pattern of an internal layer of the circuit board 20 and is also conducted from the control wiring 22, which is connected to the primary strut 43, to the temperature sensor 27.

Figure 8A:
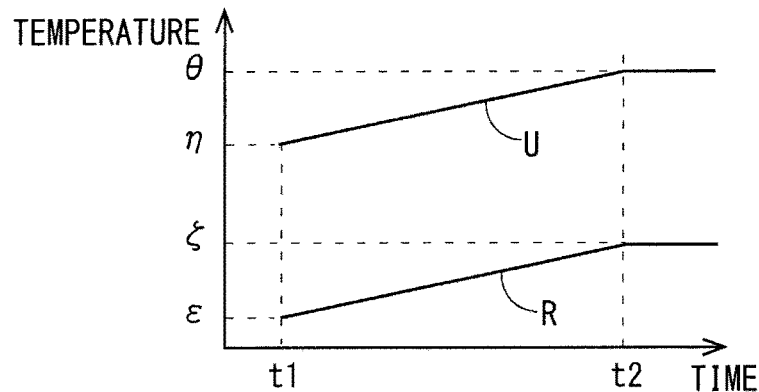
FIGS. 8A to 8C are graphs that indicate a change in a sensed temperature of a temperature sensor and a change in an exothermic temperature of heat-generating devices with time according to the comparative example.
Figure 8B:
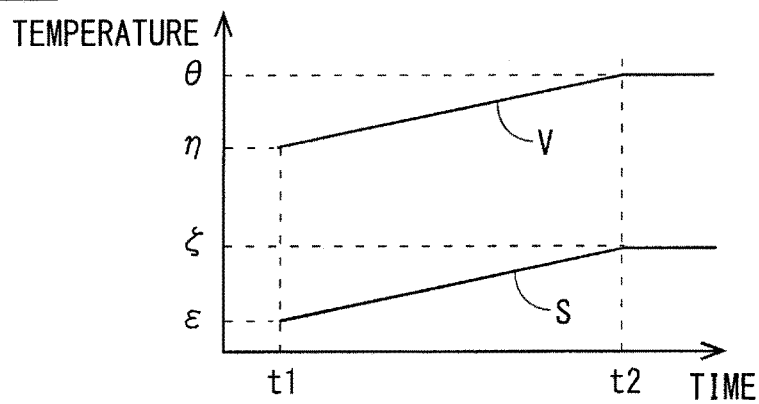
Figure 8C:
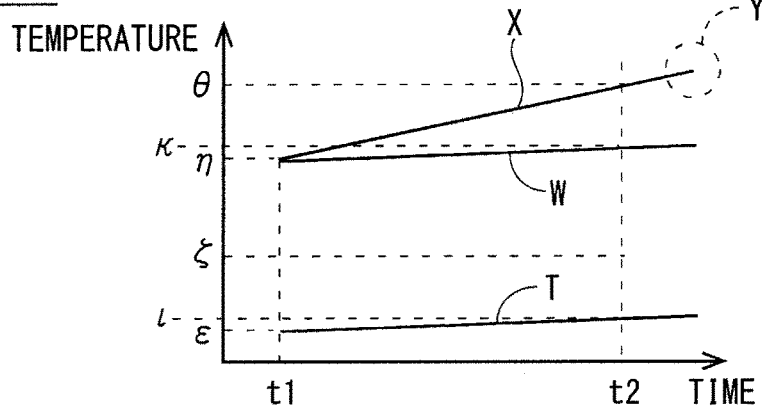

In each of the graphs of FIGS. 8A, 8B and 8C, a lower solid line R, S, T indicates the temperature of the temperature sensor 27, which is sensed with the microcomputer 28. Furthermore, in each of the graphs of FIGS. 8A, 8B, 8C, an upper solid line U, V, W indicates the temperature of the switching device 24, which is estimated by the microcomputer 28. In the graph of FIG. 8C, a solid line X indicates the actual temperature of the switching devices 24 of the first drive circuit 51.

The graph of FIG. 8A indicates a change in the temperature R of the temperature sensor 27 and a change in the estimated temperature U of the switching devices 24 with time in the case where the first drive circuit 51 and the second drive circuit 52 of the electronic apparatus 100 of the comparative example are both normally operated. In this case, during the time period from the time t1 to the time t2, the temperature R of the temperature sensor 27 changes from the temperature ε to the temperature ζ, and the estimated temperature U of the switching devices 24 changes from the temperature η to the temperature θ. Here, it should be noted the temperature θ is the operable temperature of the switching devices 24.

The graph of FIG. 8B indicates a change in the temperature S of the temperature sensor 27 and a change in the estimated temperature V of the switching devices 24 of the second drive circuit 52, which is operated normally, with time in the case where the first drive circuit 51 fails. In this case, during the time period from the time t1 to the time t2, the temperature S of the temperature sensor 27 changes from the temperature ε to the temperature ζ, and the estimated temperature V of the switching devices 24 changes from the temperature η to the temperature θ.

The temperature sensor 27 of the comparative example is placed adjacent to the primary strut 43, which is placed adjacent to the second drive circuit 52 that is operated normally. Therefore, the temperature S of the temperature sensor 27 changes synchronously with the temperature of the switching devices 24 of the second drive circuit 52. Therefore, the temperature S of the temperature sensor 27 in this case is substantially the same as the temperature R of the temperature sensor 27 in the case where both of the first drive circuit 51 and the second drive circuit 52 of the electronic apparatus 1 are normally operated. Thus, the microcomputer 28 can accurately estimate the estimated temperature V of the switching devices 24 of the second drive circuit 52.

In contrast, the graph of FIG. 8C indicates a change in the temperature T of the temperature sensor 27, a change in the estimated temperature W of the switching devices 24 of the first drive circuit 51 that is operated normally, and a change in the actual temperature X of the switching devices 24 of the first drive circuit 51 with time in the case where the second drive circuit 52 fails. In this case, during the time period from the time t1 to the time t2, the temperature T of the temperature sensor 27 changes from the temperature ε to the temperature ι, and the estimated temperature W of the switching devices 24 changes from the temperature η to the temperature κ.

The temperature sensor 27 of the comparative example is placed adjacent to the primary strut 43 that is placed adjacent to the failed second drive circuit 52. Therefore, the temperature T of the temperature sensor 27 of FIG. 8C, which is sensed with the microcomputer 28, is reduced below the temperature R of the temperature sensor 27 of FIG. 8A or the temperature S of the temperature sensor 27 of FIG. 8B upon lapse of time. Therefore, the estimated temperature W of the switching devices 24 of the first drive circuit 51, which is operated normally, is erroneously estimated as the temperature that is lower than the actual temperature X of the switching devices 24. Therefore, the microcomputer 28 of the comparative example may possibly supply the electric current, which possibly causes exceeding of the temperature of the switching devices 24 above the operable temperature B of the switching devices 24, to the switching devices 24 of the first drive circuit 51, which is operated normally. Thus, in the comparative example, the actual temperature X of the switching devices 24 of the first drive circuit 51 may exceed above the operable temperature B of the switching devices 24 at a point indicated by a dotted circle Y in FIG. 8C to possibly cause failure of the first drive circuit 51 in addition to the failed second drive circuit 52.

In contrast to the comparative example, the electronic apparatus 1 of the present embodiment provides the following advantages.

(1) In the present embodiment, the temperature sensor 27 is placed at the corresponding location, which is spaced from the primary struts 42, 43, the switching devices 24, the shunt resistors 25, the drive wiring 21 and the motor wiring 8, and at which the temperature of the secondary strut 44 can be sensed with the temperature sensor 27 (i.e., the corresponding location, at which the temperature of the secondary strut 44 is sensed with the temperature sensor 27).

Therefore, the heat, which is generated from, for example, the switching devices 24, is absorbed by the heat sink main body 41 through the drive wiring 21 and the primary struts 42, 43. Thus, the temperature change of the primary strut 42, 43 and an adjacent portion of the heat sink main body 41 placed adjacent to the primary struts 42, 43 becomes large. In contrast, the temperature change of the secondary struts 44, 45, which are located on the opposite side of the drive wiring 21 (the drive wiring 21 conducting the large current) and the switching devices 24 with respect to the connector terminals 30, is moderate, and the temperature change of an adjacent portion of the heat sink main body 41 located adjacent to the secondary struts 44, 45 is moderate to keep the stable temperature. Therefore, even in the case where one (or more) of the switching devices 24 of one of the drive circuits fails, the microcomputer 28 can relatively accurately estimate the temperature of the switching devices 24 of the normal drive circuit(s) by using the stable temperature sensed with the temperature sensor 27 as the reference temperature. Therefore, in the electronic apparatus 1, the switching devices 24 of the normal drive circuit(s) can be used within the temperature range, in which the switching devices 24 are safely operable.

(2) In the present embodiment, the drive wiring 21 is connected to the primary struts 42, 43 and is not connected to the secondary struts 44, 45. In contrast, the control wiring 22 is not connected to the primary struts 42, 43 and is connected to the secondary strut 44.

Therefore, the heat, which is generated from the switching devices 24 and the drive wiring 21, is absorbed by the heat sink main body 41 through the primary struts 42, 43. In contrast, the temperature of the secondary strut 44, to which only the control wiring 22 is connected, is stabilized.

(3) In the present embodiment, in the case where one of the drive circuits fails, the microcomputer 28 limits the electric current, which is supplied through the switching devices 24 of the other normal drive circuit, based on the sensed temperature of the temperature sensor 27 and the current value of the electric current supplied to the switching devices 24.

In this way, in the electronic apparatus 1, even in the case where the one of the drive circuits fails, the switching devices 24 of the other normal drive circuit can be used within the temperature range, in which the switching devices 24 are safely operable.

(4) In the present embodiment, the temperature sensor 27 is the single temperature sensor installed to the circuit board 20.

Therefore, the size of the electronic apparatus 1 can be reduced or minimized.

Second Embodiment

Figure 9:
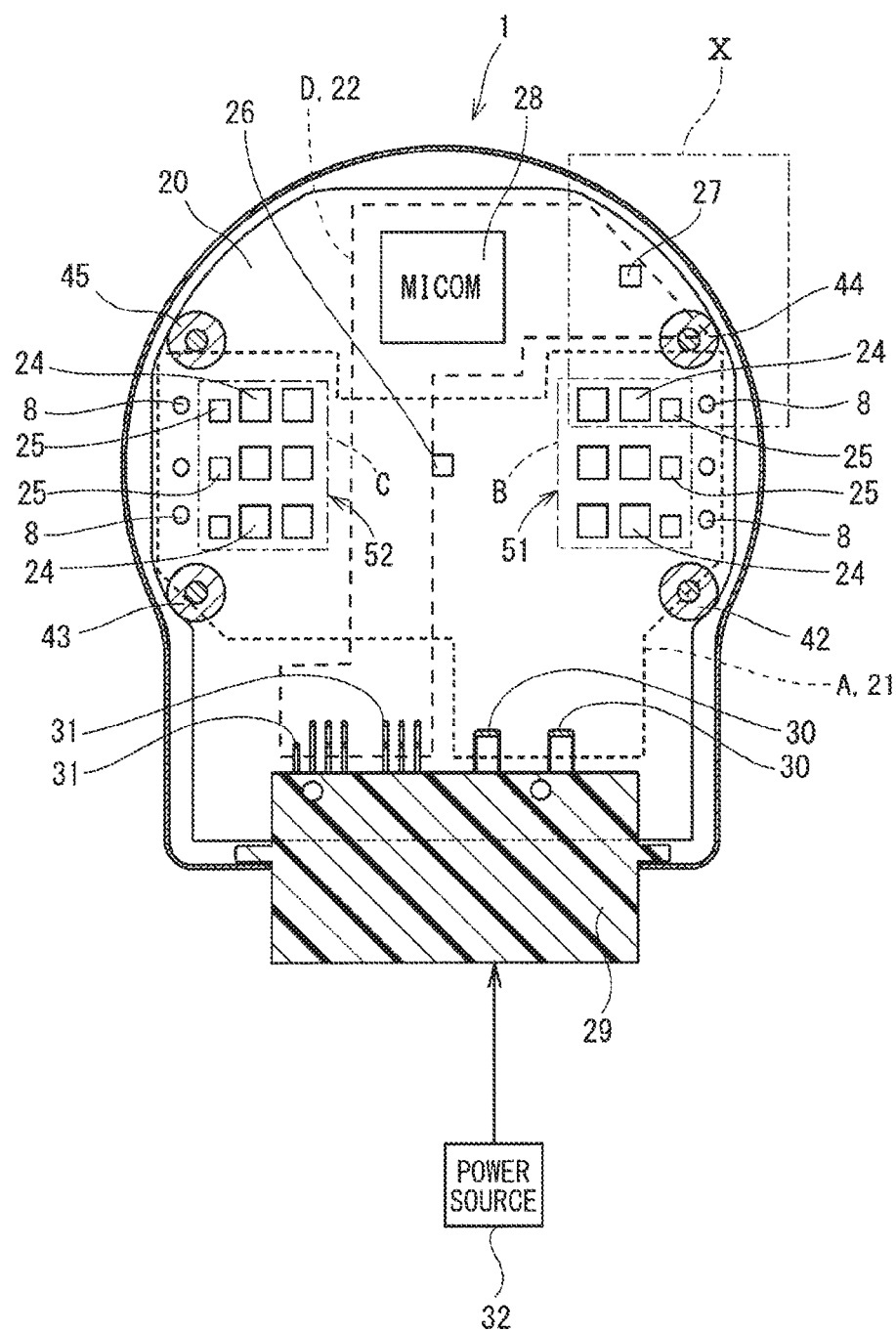
FIG. 9 is a schematic diagram of a circuit board of an electronic apparatus according to a second embodiment of the present disclosure.
Figure 10:
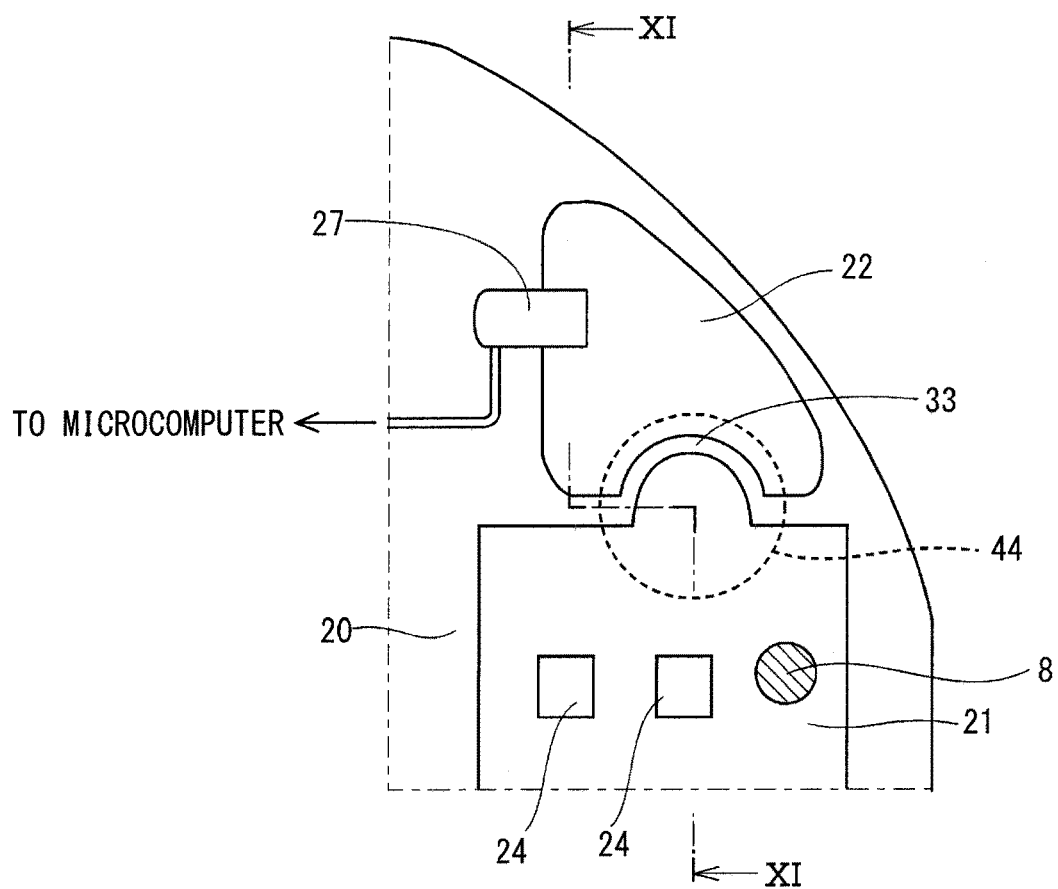
FIG. 10 is a schematic diagram of a surface wiring in an area X in FIG. 9.

FIGS. 9 to 11 indicate a second embodiment of the present disclosure. In the second embodiment, each corresponding structure (component), which is the same as that of the first embodiment, will be indicated by the same reference sign and will not be described redundantly for the sake of simplicity.

In the second embodiment, the drive wiring 21 is connected to both of the primary struts 42, 43 and the secondary struts 44, 45. In contrast, the control wiring 22 is connected to the secondary strut 44 and is not connected to the primary struts 42, 43. Furthermore, in the second embodiment, as shown in FIG. 10, at a location where the secondary strut 44 and the circuit board 20 contact with each other, resin 33, which forms the circuit board 20, is interposed between the drive wiring 21 and the control wiring 22, both of which are connected to the secondary strut 44.

As indicated by arrows K1-K6 in FIG. 11, the heat, which is generated from the drive wiring 21 and the switching devices 24, is absorbed by the heat sink main body 41 through the primary struts 42, 43 and the secondary struts 44, 45. However, this heat is not directly conducted to the control wiring 22 due to the presence of the resin 33 interposed between the drive wiring 21 and the control wiring 22.

Since the heat capacity of the heat sink main body 41 is large, the temperature of the heat sink main body 41 is stabilized. The heat of the heat sink main body 41 is conducted from the secondary strut 44 to the temperature sensor 27 through the control wiring 22, as indicated by arrows K7, K8. Therefore, the microcomputer 28 can sense the temperature of a portion of the secondary strut 44, which has the relatively stable temperature, through the temperature sensor 27.

In the second embodiment, even in the case where one or more of the switching devices 24 of one of the drive circuits fails, the microcomputer 28 can relatively accurately estimate the temperature of the switching devices 24 of the normal drive circuit(s) by using the stable temperature sensed with the temperature sensor 27 as the reference temperature.

Other Embodiments (1) In the above embodiments, the electronic apparatus 1, which controls the electric motor of the electric power steering system, is described. In another embodiment, the application of the electronic apparatus 1 is not necessarily limited to the electric power steering system, and the electronic apparatus of the present disclosure may be applied as an electronic apparatus that controls an electric motor used in other various systems or apparatuses.

(2) In the above embodiments, the electronic apparatus 1, which is formed integrally with the electric motor 3, has been described. In another embodiment, the electronic apparatus of the present disclosure may be formed as a separate member that is separate from the electric motor 3.

(3) In the above embodiments, the switching devices 24 and the shunt resistors 25 are described as the examples of the heat-generating devices, which generate the heat when the electric current is supplied thereto. In another embodiment, the heat-generating device(s) may be other type(s) of electronic component(s), such as a choke coil(s), a capacitor(s), a relay(s) or the like.

(4) In the above embodiments, there is described the electronic apparatus, which includes the drive circuits that form the two systems, respectively. In another embodiment, the electronic apparatus of the present disclosure may be formed to have a single drive circuit, which forms the single system, or the electronic apparatus of the present disclosure may be formed to have three or more drive circuits that form three or more systems, respectively.

(5) In the above embodiments, there is described the multilayer circuit board, which includes the four layers. In another embodiment, the circuit board of the present disclosure may be formed as a single layer circuit board or a multilayer circuit board, which includes five or more layers.

As discussed above, the present disclosure should not be limited to the above embodiments, and the structures (components) of the above embodiments may be combined in any appropriate manner to implement various other embodiments within a scope of the present disclosure.

What is claimed is:

1. An electronic apparatus for controlling a drive operation of an electric motor, comprising:
    a circuit board;
    a connector terminal that is installed to the circuit board and receives an electric current, which is supplied from an external electric power source to a coil of the electric motor;
    a plurality of heat-generating devices that are installed to the circuit board and generate heat when the electric current to be supplied to the coil is conducted through the plurality of heat-generating devices;
    a drive wiring that is installed to the circuit board and conducts the electric current among:
        a motor wiring, which is connected to the coil;
        the plurality of heat-generating devices; and
        the connector terminal;
    a heat sink main body that absorbs the heat generated from the plurality of heat-generating devices;
    a primary strut that extends integrally from the heat sink main body and supports the circuit board at a location between:
        the connector terminal; and
        one of the plurality of the heat-generating devices, the drive wiring, or the motor wiring;
    a secondary strut that extends integrally from the heat sink main body and supports the circuit board at a location that is on an opposite side of the plurality of heat-generating devices, the drive wiring and the motor wiring, which is opposite from the connector terminal;
    a temperature sensor that is installed to the circuit board at a location, which is spaced from the primary strut, the plurality of heat-generating devices, the drive wiring and the motor wiring, and at which the temperature sensor senses a temperature of the secondary strut; and
    a control device that limits the electric current supplied to the plurality of heat-generating devices while using the temperature, which is sensed with the temperature sensor, as a reference temperature.

2. The electronic apparatus according to claim 1, comprising:
    a control connector terminal that is installed to the circuit board and receives an electric current to be supplied to the control device; and
    a control wiring that is installed to the circuit board and electrically connects among the control connector terminal, the control device and the temperature sensor, wherein:
    the drive wiring is not connected to the secondary strut and is connected to the primary strut; and
    the control wiring is not connected to the primary strut and is connected to the secondary strut.

3. The electronic apparatus according to claim 1, comprising:
    a control connector terminal that is installed to the circuit board and receives an electric current to be supplied to the control device; and
    a control wiring that is installed to the circuit board and electrically connects among the temperature sensor, the control device and the control connector terminal, wherein:
    the drive wiring is connected to the primary strut and the secondary strut;
    the control wiring is not connected to the primary strut and is connected to the secondary strut; and
    resin, which forms the circuit board, is interposed between:
        the drive wiring, which is connected to the primary strut; and
        the control wiring.

4. The electronic apparatus according to claim 1, wherein:
    the drive wiring and the plurality of heat-generating devices form a plurality of drive circuits that drive the electric motor;
    when one of the plurality of drive circuits fails, the control device limits the electric current to be supplied to a corresponding one or more of the plurality of heat-generating devices provided in another one of the plurality of drive circuits, which is normal, based on:
        the temperature, which is sensed with the temperature sensor; and
        a current value of the electric current supplied to the corresponding one or more of the plurality of heat-generating devices provided in the normal one of the plurality of drive circuits.

5. The electronic apparatus according to claim 1, wherein the temperature sensor is a single temperature sensor on the circuit board.

* * * * *